United States Patent [19]

Doi et al.

[11] Patent Number: 4,950,925
[45] Date of Patent: Aug. 21, 1990

[54] PRE-CHARGE CIRCUIT WITH A BIPOLAR TRANSISTOR

[75] Inventors: Toshio Doi, Kokubunji; Takehisa Hayashi, Kodaira; Kenichi Ishibashi, Kokubunji, all of Japan

[73] Assignee: Hitachi, Ltd., Tokyo, Japan

[21] Appl. No.: 246,196

[22] Filed: Sep. 19, 1988

[30] Foreign Application Priority Data

Sep. 24, 1987 [JP] Japan ................. 62-237134

[51] Int. Cl.⁵ ............................. H03K 19/01
[52] U.S. Cl. .................. 307/446; 307/452; 307/481; 307/570
[58] Field of Search ............ 307/443, 446, 448, 451, 307/452–453, 481, 570, 270

[56] References Cited

U.S. PATENT DOCUMENTS

| 4,700,086 | 10/1987 | Ling et al. ........................... 307/443 |
| 4,730,132 | 3/1988 | Watanabe et al. .................. 307/446 |
| 4,760,293 | 7/1988 | Hebenstreit ..................... 307/446 X |
| 4,780,626 | 10/1988 | Guerin et al. ....................... 307/448 |
| 4,791,320 | 12/1988 | Kawata et al. ................. 307/451 X |
| 4,841,172 | 6/1989 | Ueno et al. ........................ 307/443 |

Primary Examiner—David Hudspeth
Attorney, Agent, or Firm—Antonelli, Terry, Stout & Kraus

[57] ABSTRACT

An output signal of a logic portion is inputted to the gate of FET inside an output buffer portion to inverse the signal polarity by this FET and is outputted through a bipolar transistor effecting an emitter follower operation or the like. An FET controlled by a clock signal is disposed between the base of the bipolar transistor and the ground and an FET which is turned ON during a pre-charge operation and when the bipolar transistor is OFF during logic calculation is disposed between the emitter and the ground so as to short-circuit the emitter and the ground during the pre-charge operation. In this manner, higher operation speed, higher integration density and high operation margin can be accomplished without losing the characteristic features of a Bi-CMOS dynamic logic circuit in its high operation speed and low power dissipation.

26 Claims, 4 Drawing Sheets

PRE-CHARGE CIRCUIT WITH A BIPOLAR TRANSISTOR

BACKGROUND OF THE INVENTION

1. Field of the Invention

This invention relates generally to a semiconductor large scale integrated circuit (LSI), and more particularly to a dynamic logic circuit which will be suitable for accomplishing a Bi-CMOS LSI for a high speed logic circuit.

2. Description of the Prior Art

The circuit disclosed in Japanese Patent Laid-Open No. 163716/1986 is known as a high speed dynamic logic circuit for an MOS LSI consisting of a logic portion for effecting predetermined logic calculations by a dynamic operation, which consists of MOS FETs, and a Bi-CMOS output buffer portion for outputting the result of calculation.

An example of the prior art technique described above is depicted in FIG. 6 of the accompanying drawings. In this example, a logic portion 25 consisting of a PMOS FET 30 and NMOS FETs 32–35 executes predetermined logic calculation for those signals which are inputted to data signal input terminals 42–44 and the result of calculation is outputted to a node 41. This output is inputted to an output buffer portion 26 consisting of a PMOS FET 31, NMOS FETs 36–38 and NPN bipolar transistors 39, 40 to produce an output from an output signal terminal 13.

Generally, the operation of a dynamic logic circuit consists of a precharge operation which is carried out in preparation before calculation and a calculation operation which continues the former. In the prior art example described above, these operations are carried out in the following way. First of all, a clock signal input terminal 7 is set to a ground potential to execute the pre-charge operation. As a result, the PMOS FET 30 is turned ON while NMOS FETs 35 and 38 are turned OFF. The potential of a node 41 rises to a power source potential and NMOS FETs 36 and 37 are turned ON while PMOS FET 31 are turned OFF. A bipolar transistor 39 is turned OFF. Furthermore, a base current flows through a bipolar transistor 40 through the MOS FET 37 to turn ON this transistor and a parasitic capacitance is discharged to reduce the potential. At this time, since an output signal terminal 13 is connected to a logic circuit of a next stage, the potential is preferably reduced down to the ground potential in order to secure a noise margin. In the circuit of the prior art technique described above, however, the bipolar transistor 40 is turned OFF when the potential of the output signal terminal drops to the base-emitter junction voltage $V_{BE}$ (approx. 0.7 V) of the bipolar transistor, and does not drop below this potential. Therefore, the drop of noise margin is likely to occur during the operation of LSI.

Next, in order to execute calculation, a terminal 7 is set to the power source potential. Accordingly, NMOS FETs 35 and 38 are turned 0N while PMOS FET 30 is turned OFF. If the node 41 and the ground are connected by data inputted to input terminals 42–44 in this instance, the potential of this node drops so that NMOS FETs 36 and 37 are turned OFF while PMOS FET 31 is turned ON, the potential of a node 46 rises, turning ON a bipolar transistor 39. Therefore, the parasitic capacitance 12 is charged and the output potential rises. Even if the potential of the node 41 starts dropping in this calculation operation, the potential of the node 46 does not rise until it is above the threshold voltage of a CMOS inverter consisting of MOS FETs 31 and 36. Accordingly, turn-ON of the bipolar transistor 39 is delayed and the delay time increases.

Furthermore, since this example uses as many as four MOSFETs and two bipolar transistors in the buffer portion, the layout area increases, thereby impeding higher integration of LSI.

SUMMARY OF THE INVENTION

It is therefore an object of the present invention to eliminate the problems of the prior art technique described above, and to accomplish higher operation speed, higher integration density and higher margine without spoiling the characteristic features of a Bi-CMOS dynamic logic circuit in its high operation speed and low power dissipation.

In accordance with the present invention there is provided a semiconductor logic circuit which comprises a logic circuit network for inputting at least one input signal and for producing an output which sets a first output node to substantially the same potential as the potential of a first or second power source in response to the input signal; a switch device connected between the first output node and the second power source; a first clock signal for complementarily switching the logic circuit network and the switch device so that the output of the first output node is substantially equal to the potential of the first or second power source; a first FET having the gate thereof connected to the first output node; a bipolar transistor having a base for receiving the output signal from the output terminal of the first FET, one of the ends thereof on the output side connected to a fourth power source and the other end thereof connected to a second output node; a second FET having one of the ends thereof on the output side connected to the second output node and the other end connected to a third power source; and means for complementarily switching the bipolar transistor and the second FET when the output potential of the second output node is determined by the fourth power source and when it is substantially equal to the potential of the third power source.

More definitely, said logic circuit network is operated to output to said first and second output nodes, by said clock signal in a dynamic logic calculation which comprises a combination of a pre-charge phase and a phase of logic calculation succeeding to the former. A definite example of action is as follows.

In the pre-charge operation, the base of the bipolar transistor and the ground and the output signal terminal and the ground are short-circuited by MOS FET. Therefore, the output drops to the ground potential. During calculation, when the potential of the output node of the logic portion goes beyond the threshold voltage of PMOS FET and is turned ON, a base current starts flowing simultaneously through the bipolar transistor so that the delay time can be reduced. Furthermore, since the number of devices is smaller than that of the prior art circuit, the layout area can be reduced, too.

The foregoing and other objects, advantages, manner of operation and novel features of the present invention will be understood from the following detailed description when read in connection with the accompanying drawings.

DESCRIPTION OF THE PREFERRED EMBODIMENTS

Hereinafter, preferred embodiments of the present invention will be described.

Figure 1A:
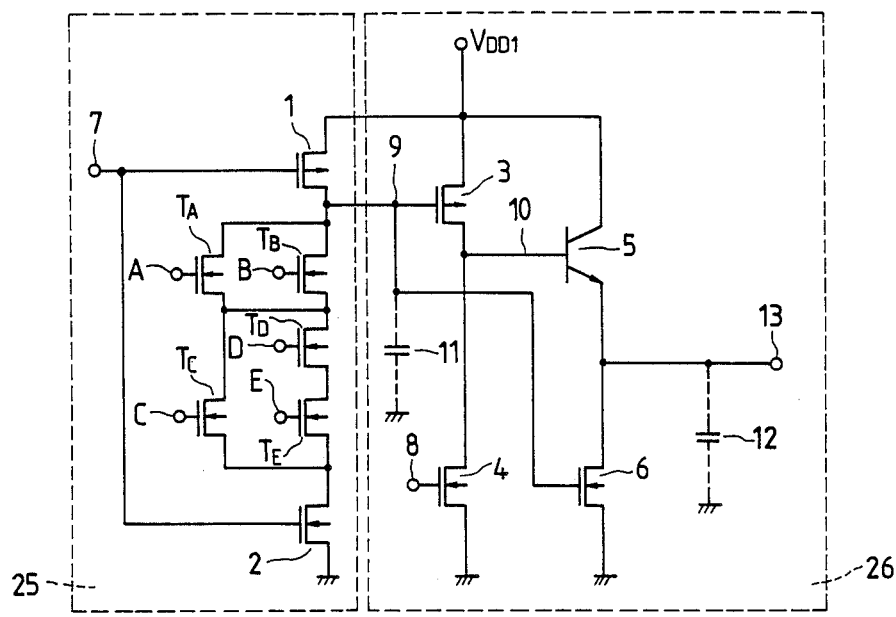
FIG. 1(a) is a circuit diagram of a logic circuit in accordance with the embodiment of the present invention.

In FIG. 1(a), reference numerals 1 and 3 represents PMOS FETs; 2, 4 and 6 and TA-TE are NMOS FETs; 5 is an NPN bipolar transistor; 7 and 8 are clock signal input terminals; A–E are data input signal input terminals; 9 and 10 are nodes inside the circuit; 11 and 12 are parasitic capacitance such as wiring capacitance; 13 is an output signal terminal; 25 is a logic portion; 26 is an output buffer portion; and symbol $V_{DD1}$ represents a power source terminal. Incidentally, this embodiment employs the circuit structure such that the result of logical calculation of $(A+B)\cdot(C+D\cdot E)$ for the input signals A–E is outputted to 13, but a logic circuit for executing arbitrary logical calculation can be accomplished by changing the structure of the logic portion.

Figure 1B:
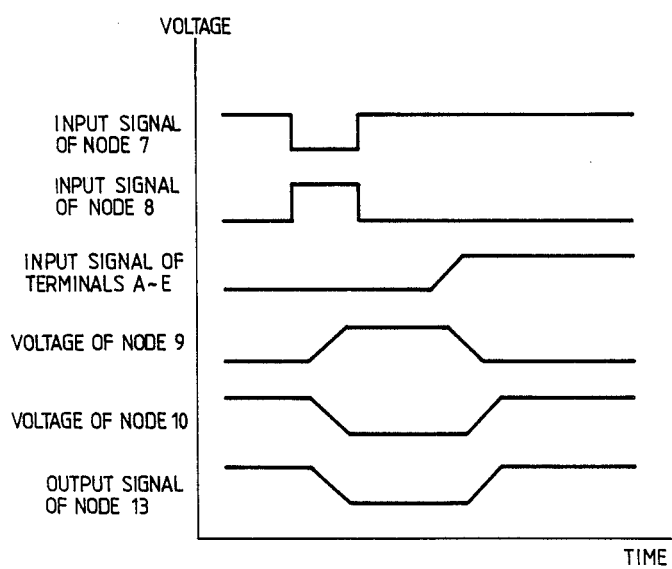
FIG. 1(b) is a waveform diagram of operation waveforms of the logic circuit.

FIG. 1(b) shows the waveform at each portion of this circuit. Hereinafter, the circuit operation will be explained with reference to these drawings. First of all, a pre-charge operation is carried out by setting the clock signal input terminal 7 to the ground potential (hereinafter referred to as the "low" level) and 8 to the power source potential (hereinafter referred to as the "high" level). In the interim, the input signals A–E are set to the low level by the circuit not shown in the drawings. These input signals turn ON MOS FETs 1, 4 and turn OFF MOS FET 2 and TA–TE, the parasitic capacitance 11 is charged through MOS FET 1 and the node 9 rises to the high level. Therefore, MOS FET 3 is turned OFF, MOS FET 6 is turned ON and the node 10 drops to the low level. In consequence, the parasitic capacitance 12 is discharged through MOS FET 6 and the potential of the output signal terminal 13 drops to the low level.

Next, when the clock signal input terminal 7 is set to the high level and 8 to the low level, MOS FET 1 is turned OFF while 2 is turned ON and logical calculation is started. Here, if the high level is applied to part or the whole of A through E so that the node 9 and the ground become conductive, the parasitic capacitance 11 is discharged and the potential of the node 9 drops. When this potential becomes lower than the power source potential by the threshold voltage of PMOS FET, MOS FET 3 is turned ON, the potential of the node 10 rises and the bipolar transistor 5 is turned ON. Accordingly, the parasitic capacitance 12 is charged from $V_{DD1}$ through the bipolar transistor 5. At this time charging is effected rapidly due to the large current drivability of the bipolar transistor and the potential of the node 13 rises rapidly.

As described above, it does not occur in the present invention that both MOS FETs 3 and 4 are turned ON simultaneously and the bipolar transistor 5 and MOS FET 6 are turned ON simultaneously. Therefore, the power source current flows only transiently when the output level changes but does not flow D.C.-wise. For this reason, power dissipation can be reduced. The output drops completely to the low level at the time of the pre-charge operation and a sufficient noise margin can be secured consequently. Furthermore, the potential at the node 10 starts simultaneously when the potential of the output node 9 of the logic portion exceeds the threshold voltage of PMOS FET 3 during the calculation operation and for this reason, the delay time can be reduced in comparison with the prior art circuit. In this embodiment, only three MOS FETs and one bipolar transistor are necessary in the buffer portion 26 so that the number of devices and the layout area can be reduced in comparison with the prior art circuit. Accordingly, this embodiment is suitable for higher integration of LSI together with low power dissipation.

Figure 2:
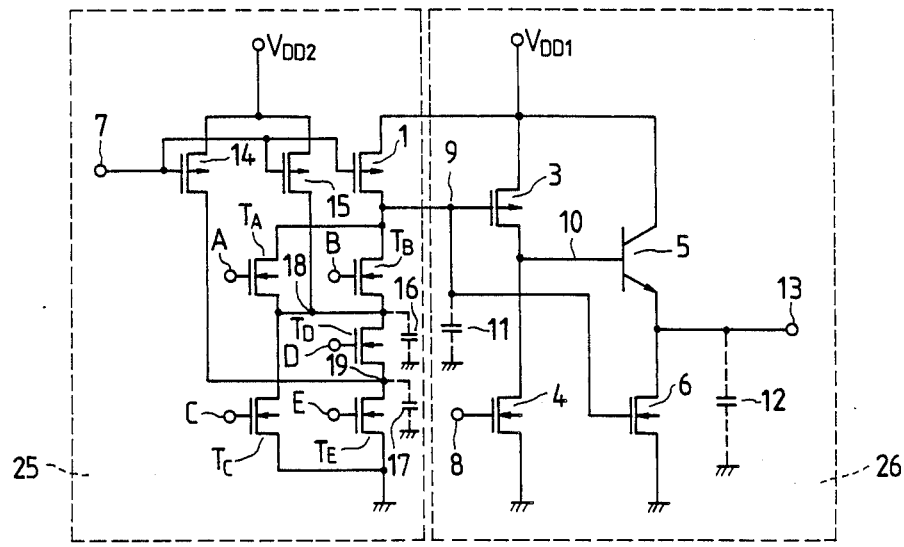
FIGS. 2, 3 and 4 are circuit diagrams of the logic circuits in accordance with other embodiments of the present invention.

Next, FIG. 2 shows a modified embodiment wherein the logic portion of the circuit shown in FIG. 1 is changed. MOS FET 2 is delected and MOS FETs 14 and 15 to the gates of which the clock signals are inputted are disposed between the nodes 18, 19 and the power source terminal $V_{DD2}$ inside the logic portion. In this embodiment, the impedance of the path for discharging the parasitic capacitance 11 is shorter than that of the circuit shown in FIG. 1, so that discharge is effected more rapidly and the calculation time can be shortened. Since pre-charge MOS FET is disposed for each node inside the logic portion, the pre-charge time of the parasitic capacitance 16 and 17 can be shortened.

Figure 3:
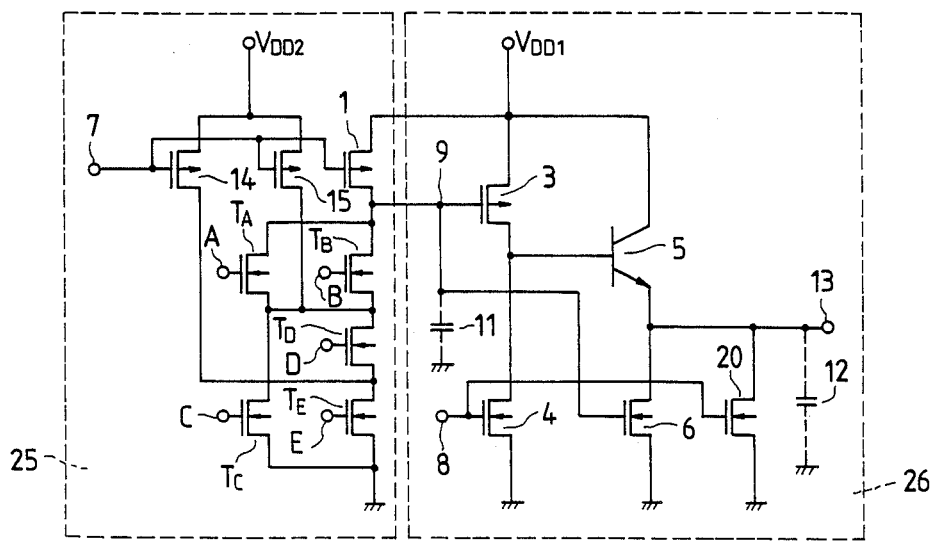

Next, FIG. 3 shows another embodiment of the invention which will be suitable when the parasitic capacitance of the output terminal is great. In the embodiment shown in FIG. 2, the parasitic capacitance 12 is discharged by MOS FET 6 at the time of pre-charge but this parasitic capacitance can be a great capacity if the wiring connected to the output signal terminal 13 is long or if the number of fan-outs is great. In such cases, the gate width of MOS FET 6 must be enlarged in order to shorten the pre-charge time but in such a case, the gate capacitance increases and the parasitic capacitance at the node 9 increases so that the calculation time becomes longer, on the contrary. FIG. 3 shows an embodiment which solves this problem, and MOS FET 20 is added to the circuit shown in FIG. 2. The drain of this FET 20 is connected to the output terminal 13, its gate is connected to the clock input terminal and its source is grounded. The gate width of MOS FET 6 is set to a small width in order to limit the parasitic capacitance 11 and to shorten the calculation time while the gate width of MOS FET 20 is set to a large width in order to reduce the pre-charge time. In this circuit, MOS FETs 6 and 20 are simultaneously turned ON at the time of the pre-charge operations and the discharge of the parasitic capacitance 12 is effected within a short period. On the other hand, MOS FET 20 is turned OFF when the pre-charge operation is complete and calculation is to be started but since the potential of the output terminal 13 has already dropped to the low level, the output during the calculation can be kept at the low level by MOS FET 6 having a small gate width alone. Incidentally, MOS FET 6 cannot be removed because if it is removed, the output terminal will enter the floating state while the output is at the low level during the calculation.

Figure 4:
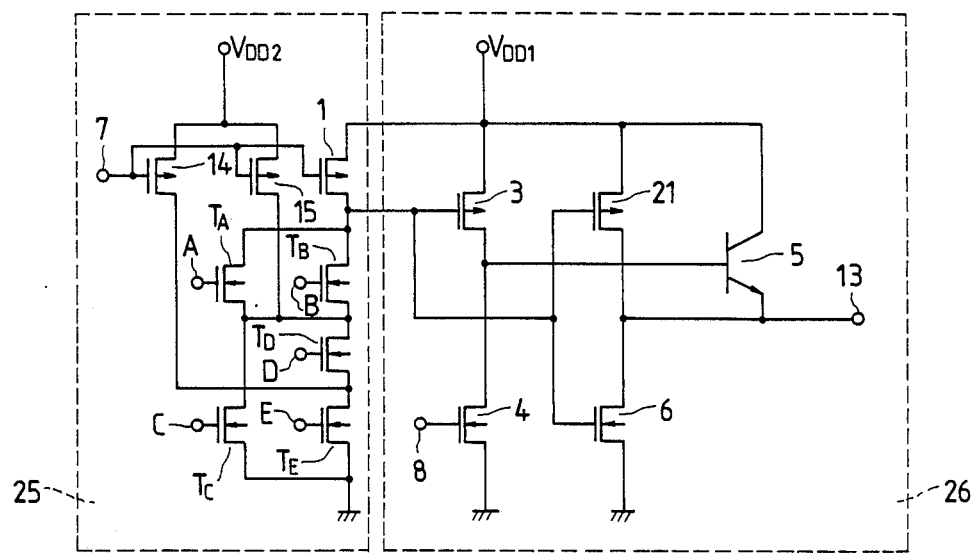

Next, FIG. 4 shows still another embodiment of the invention which enlarges output amplitude. In the embodiments shown in FIGS. 1 to 3, the upper limit of the output voltage of the output signal terminal 13 is the potential which is lower than the power source voltage by the base-emitter junction voltage $V_{BE}$ (approx. 0.7 V) of the bipolar transistor.

On the other hand, FIG. 4 shows the embodiment wherein the output swings fully from the ground potential to the power source potential in the same way as in a CMOS circuit. There is disposed an MOS FET 21 whose drain is connected to the output signal terminal 13, whose gate is connected to the output node 9 of the logic portion and whose source is connected to the power source $V_{DD1}$. This MOS FET is turned ON when the output is at the high level and the potential of the output terminal 13 rises to the power source potential. In this embodiment, incidentally, there may be the case where the base potential of the bipolar transistor 5 is temporarily higher than the collector potential due to the capacitance between the base and emitter and the bipolar transistor gets into saturation when the output rises to the potential of the power source voltage. This problem can be solved by, for example, connecting the collector of the bipolar transistor to a power source higher than $V_{DD1}$.

In the embodiments shown in FIGS. 2 to 4 the precharge MOS FET 9 of the logic portion and the output buffer portion are connected to the power source $V_{DD1}$ and the precharge MOS FETs 14 and 15 of the internal nodes of the logic portion are connected to the power source $V_{DD2}$. These embodiments operate when the potential of $V_{DD2}$ is equal to that of $V_{DD1}$ but the signal amplitude of the nodes inside the logic portion can be reduced by setting the potential of $V_{DD2}$ lower than the potential of $V_{DD1}$ and the circuit operation speed can be further improved. The lower the potential of $V_{DD2}$ at this time, the higher the operation speed but the smaller the operation margine, on the contrary. However, it is possible to improve the circuit operation while securing the operation margin by setting the potential of $V_{DD2}$ to the potential which is lower than the potential of $V_{DD1}$ by the threshold voltage of NMOS.

Figure 5A:
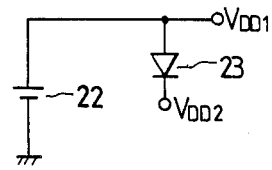
FIG. 5 is a circuit diagram showing examples of $V_{DD2}$ voltage generation circuits.
Figure 5B:
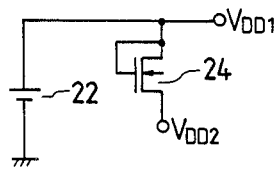
Figure 6:
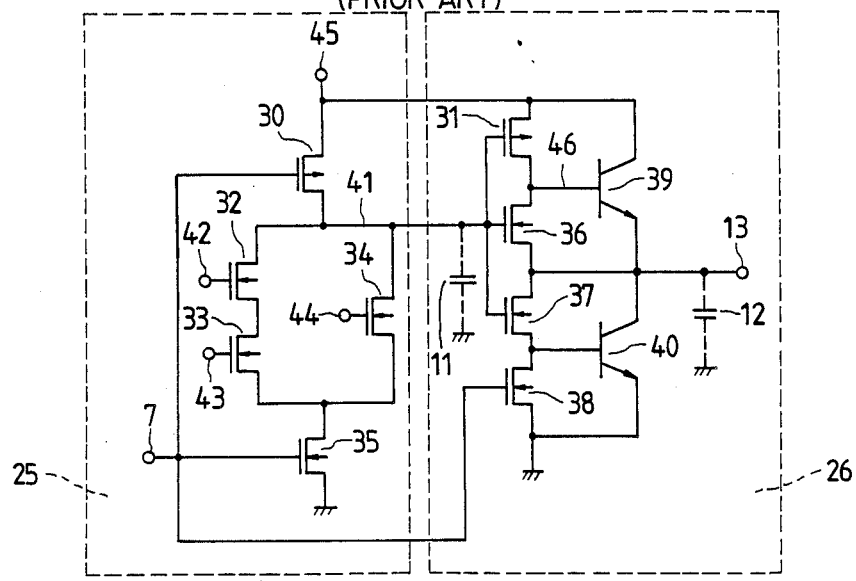
FIG. 6 is a circuit diagram of the prior art circuit.

$V_{DD2}$ thus set can be supplied from outside the LSI chip in the same way as $V_{DD1}$ but connection bonding pads and power supply wirings must be disposed afresh. Therefore, $V_{DD2}$ is preferably generated in the circuit on the LSI chip by other power source. FIG. 5 shows examples of the $V_{DD2}$ generation circuit. FIG. 5(a) shows a circuit which generates $V_{DD2}$ from $V_{DD1}$ by use of a voltage drop in the forward direction of a diode 23 and (b) shows a circuit which generates $V_{DD2}$ lower than $V_{DD1}$ by the threshold voltage by use of an NMOS FET. $V_{DD2}$ can be generated on the LSI chip by use of either of these circuits. Since the number of devices necessary for these circuits is small, $V_{DD2}$ can be supplied by disposing this circuit for each or a plurality of logic circuits shown in FIGS. 2 to 4 while limiting the increase in the layout area to a negligible level.

Figure 7:
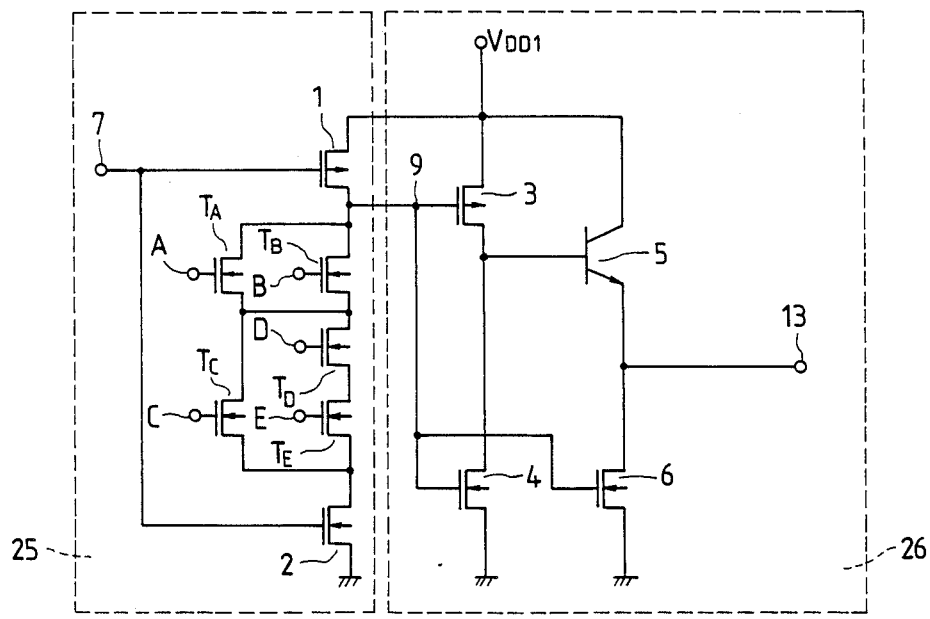
FIG. 7 is a circuit diagram of still another embodiment of the present invention.

FIG. 7 shows still another embodiment of the invention wherein the gate of NMOS FET 4 is connected to the output node 9 of the logic portion. In this embodiment, the phase of the clock signal is one phase whereas two phases are necessary in the other embodiments. Therefore, the driver circuit and wirings necessary for clock power supply can be reduced.

As described above, higher operation speed, increase in the operation margin and high integration density can be accomplished by applying the present invention to the Bi-CMOS dynamic logic circuit.

Though the logic portion in the embodiments described above consists of NMOS FETs, it is of course possible to constitute it by PMOS FETs. In such a case, the present invention can be applied as such by inversing the conductivity types of MOS FETs and bipolar transistors and the polarity of input signals.

As described above, the present invention provides the effects that higher operation speed, higher integration density and higher margin can be accomplished without losing the characteristic features of a Bi-CMOS dynamic logic circuit in its high speed operation and low power dissipation.

What is claimed is:

1. A semiconductor logic circuit comprising:
   a logic circuit network being connected to a first power source and having means for receiving a first clock signal, means for inputting at least one input signal and means for producing an output which sets a first output node to substantially the same potential as the potential of said first power source or a second power source in response to said input signal;
   a switch device connected between said first output node and said second power source and having means for receiving a first clock signal;
   said first clock signal being received for complementarily switching said logic circuit network and said switch device so that the output of said first output node is substantially equal to the potential of said first or second power source;
   a first FET having a gate thereof connected to said first output node;
   a bipolar transistor having a base for receiving the output signal from an output terminal of said first FET, one end of a collector-emitter path of said bipolar transistor being connected to a fourth power source and the other end of said collector-emitter path being connected to a second output node; and
   a second FET having means for inputting said output of said first output node, one end of a source-drain path of said second FET being connected to said second output node and the other end of said source-drain path being connected to a third power source,
   wherein said bipolar transistor and said second FET are complementarily switched by said output of said first output node, and wherein the output potential of said second output node is determined by said fourth power source and said third power source.

2. A semiconductor logic circuit according to claim 1, wherein said first power source and said third power source are at the same potential and said second power source and said fourth power source are at the same potential.

3. A semiconductor logic circuit according to claim 1, wherein a source of said first FET is connected to said fourth power source and its drain is connected to the base of said bipolar transistor.

4. A semiconductor logic circuit according to claim 1, wherein said complementarily switching of said bipolar transistor and said second FET is driven by a third FET which is connected for receiving a second clock signal at its gate, and further wherein one of the ends of a source-drain path of said third FET is connected to the output terminal of said first FET.

5. A semiconductor logic circuit according to claim 1, wherein said second FET is an MOS FET of a first conductivity type whose drain is connected to said second output node and whose source is connected to said third power source, and the collector of said bipolar transistor is connected to said fourth power source with its emitter being connected to said second output node.

6. A semiconductor logic circuit according to claim 5, wherein said first FET is an MOS FET of a second conductivity type whose drain is said output terminal.

7. A semiconductor logic circuit according to claim 4, which further includes a fourth FET one of the ends of which on the output side is connected to said second output side, the gate of which inputs said second clock signal and the other end of which on the output side is connected to said third power source.

8. A semiconductor logic circuit according to claim 6, which further includes an MOS FET of a second conductivity type whose drain is connected to said second output node, whose gate is connected to said first output node and whose source is connected to said fourth power source.

9. A semiconductor logic circuit according to claim 6, which further includes an MOS FET of a first conductivity type whose drain is connected to said second output node, whose gate inputs a second clock signal and whose source is connected to said third power source.

10. A semiconductor logic circuit according to claim 9, wherein the gate of said third FET for inputting said second clock signal is connected to said first output node.

11. A semiconductor logic circuit according to claim 6, wherein said logic circuit network consists of MOSFETs of a first conductivity type.

12. A semiconductor logic circuit according to claim 11, which further includes at least one MOS FET of a second conductivity type whose drain is connected to a node inside said logic circuit network, whose gate inputs said first clock signal and whose source is connected to a fifth power source.

13. A semiconductor logic circuit according to claim 12, wherein the potential difference between said fifth power source and said first power source is smaller than the potential difference between said second power source and said first power source.

14. A semiconductor logic circuit according to claim 13, wherein said fifth power source voltage generation circuit is disposed on the same LSI chip.

15. A semiconductor logic circuit according to claim 14, wherein said fifth power source voltage generation circuit consists of a diode or a MOS FET of a first conductivity type.

16. A semiconductor logic circuit according to claim 9, wherein said logic circuit network consists of MOSFETs of a first conductivity type.

17. A semiconductor logic circuit according to claim 16, which further includes at least one MOS FET of a second conductivity type whose drain is connected to a node inside said logic circuit network, whose gate inputs said first clock signal and whose source is connected to said fifth power source.

18. A semiconductor logic circuit according to claim 17, wherein the potential difference between said fifth power source and said first power source is smaller than the potential difference between said second power source and said first power source.

19. A semiconductor logic circuit according to claim 18, wherein said fifth power source voltage generation circuit is disposed on the same LSI chip.

20. A semiconductor logic circuit according to claim 19, wherein said fifth power source voltage generation circuit consists of a diode or MOS FET of a first conductivity type.

21. A semiconductor logic circuit comprising:
a logic portion having a logic circuit which receives at least one input signal and which performs logic operations with regard to said input signal, wherein conductivity between a first output node and a first power source is determined in accordance with a result of said logical operations, said logic portion further having a first circuit which receives a first clock signal and which controls conductivity between said first output node and a second power source in accordance with said first clock signal;
an output buffer portion having a second circuit which receives output signals of said logic circuit and which inverts the received output signals, including an emitter follower transistor receiving, at the base thereof, the output signals of said second circuit and outputs from its emitter connected as a second output node;
a third circuit which receives a second clock signal and which controls conductivity between said base of said emitter follower transistor and said first power source in accordance with said second clock signal; and
a fourth circuit which receives said output signals of said logic circuit and which controls conductivity between said emitter of said emitter follower transistor and said first power source, when said first circuit is conductive.

22. A semiconductor logic circuit according to claim 21, wherein said logic portion further has at least one fifth circuit which receives said first clock signal and which controls conductivity between a third power source and at least one of internal nodes of said logic circuit, in accordance with said first clock signal.

23. A semiconductor logic circuit according to claim 21, wherein said output buffer portion further has a sixth circuit which receives said second clock signal and which controls conductivity between said emitter of said emitter follower transistor and said first power source in accordance with said second clock signal.

24. A semiconductor logic circuit according to claim 21, wherein said output buffer portion further has a seventh circuit which receives output signals of said logic circuit and outputs its inverted signals to said second which output node.

25. A semiconductor logic circuit according to claim 22, wherein the potential difference between said third power source and said first power source is smaller than the potential difference between said second power source and said first power source.

26. A semiconductor logic circuit according to claim 21, wherein said third circuit receives said output signals of said logic circuit instead of said second clock signal.

* * * * *